(12) United States Patent
Fernandez-Texon

(10) Patent No.: US 6,411,143 B1
(45) Date of Patent: Jun. 25, 2002

(54) LOCK DETECTOR FOR A DUAL PHASE LOCKED LOOP SYSTEM

(75) Inventor: Francisco Fernandez-Texon, San Jose, CA (US)

(73) Assignee: Micrel, Incorporated, San Jose, CA (US)

(*) Notice: Subject to any disclaimer, the term of this patent is extended or adjusted under 35 U.S.C. 154(b) by 0 days.

(21) Appl. No.: 09/957,201

(22) Filed: Sep. 19, 2001

(51) Int. Cl.[7] .............................................. H03L 7/06
(52) U.S. Cl. ...................................... 327/156; 375/373
(58) Field of Search ................................ 327/147–151, 327/156–160; 331/DIG. 2; 375/373, 375, 376

(56) References Cited

U.S. PATENT DOCUMENTS

| 4,072,905 A | * | 2/1978 | Keelty ........................ 329/302 |
|---|---|---|---|
| 4,361,906 A | * | 11/1982 | Sakamoto ..................... 331/14 |
| 5,751,195 A | * | 5/1998 | Black .......................... 331/1 A |
| 5,764,714 A | * | 6/1998 | Stansell et al. ............. 326/136 |
| 5,903,195 A | * | 5/1999 | Lukes et al. ................. 327/156 |
| 5,909,130 A | | 6/1999 | Martin et al. ................. 327/12 |
| 6,121,849 A | * | 9/2000 | McCollough et al. ....... 331/1 R |
| 6,133,769 A | | 10/2000 | Fontana et al. ............. 327/156 |

* cited by examiner

Primary Examiner—My-Trang Nu Ton
(74) Attorney, Agent, or Firm—Skjerven Morrill LLP; Jonathan W. Hallman

(57) ABSTRACT

A dual phase locked loop (PLL) lock detector is disclosed using a single lock detector to determine whether a dual PLL system is in a lock condition. In one embodiment, a VCO clock output from a master PLL is frequency divided to form a reference clock for a slave PLL. The lock detector monitors the slave PLL only when it determines that the master PLL is locked.

11 Claims, 6 Drawing Sheets

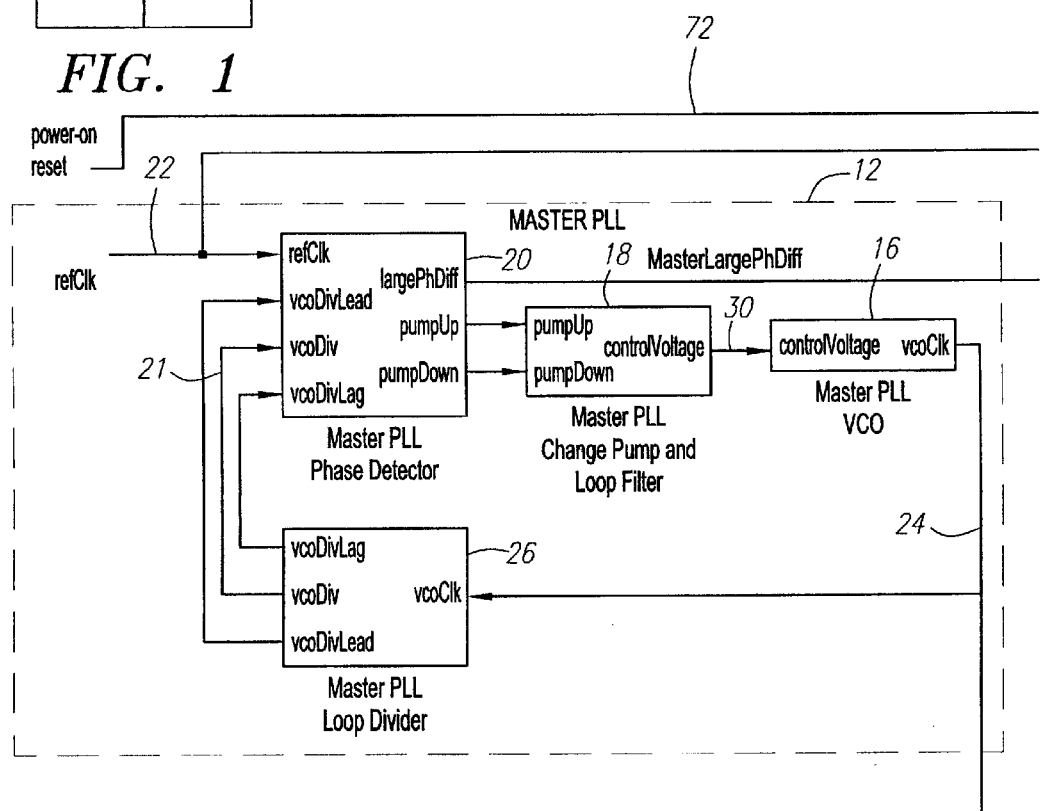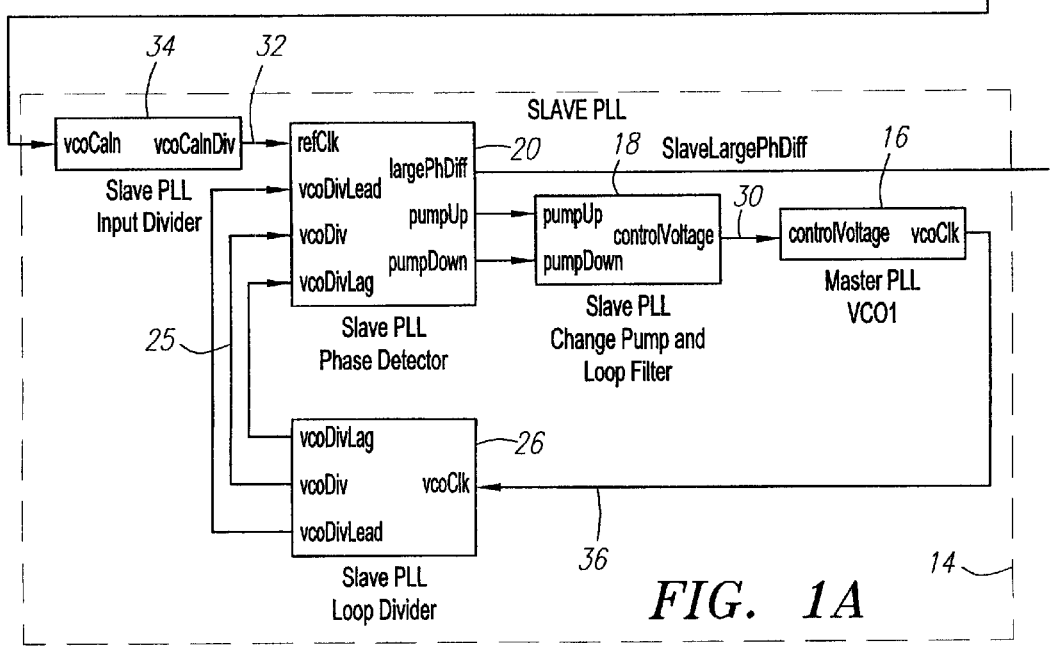
FIG. 1
FIG. 1A

LOCK DETECTOR FOR A DUAL PHASE LOCKED LOOP SYSTEM

FIELD OF INVENTION

The invention relates generally to phase locked loops, and more particularly to a lock detector for two or more phase locked loops.

BACKGROUND

A phase locked loop (PLL) adjusts the output frequency and/or phase of a clock signal synthesized by a voltage-controlled oscillator (VCO) to match a reference clock signal. The VCO clock signal loops back as a feedback signal through a loop divider that translates the frequency of the VCO signal to become a VCO divided signal. A phase detector then compares the phases of the VCO divided signal and its reference clock signal. The VCO adjusts the VCO clock signal according to this phase comparison. Such PLLs are well known and have a wide variety of applications in areas such as communication devices and other types of digital electronics.

Usually, a PLL is considered to be in lock when the phase difference between the VCO divided signal and the reference clock signal is within a certain tolerance. A PLL will often have a lock detector to indicate whether the PLL is locked. Lock detectors enable a decision to use the VCO clock signal if the PLL is in lock. Alternatively, if the lock detector indicates the PLL is not in lock, one can chose to not use the VCO clock signal. Certain applications require two phase locked loops such as in a master/slave arrangement wherein the master PLL's VCO clock signal is frequency divided and serves as the reference clock to a slave PLL. In such dual PLL applications, it would be advantageous to determine whether both PLLs are in lock. This, however, would require two conventional PLL lock detectors. Replacing these two lock detectors with a single PLL lock detector would lead to a more compact design, consume less power, and provide more on-chip integration for the same power budget.

Accordingly, there is a need in the art for a single PLL lock detector that can determine whether both PLLs in a dual PLL system are each in lock.

SUMMARY

In accordance with one aspect of the invention, a lock detector receives a first and a second signal. A first phase detector produces the first signal that indicates whether a frequency divided version of a VCO clock signal from a first phase locked loop is out of phase with the first phase locked loop's reference clock signal by a predetermined number of VCO clock cycles. A second phase detector produces the second signal which that indicates whether a frequency divided version of a VCO clock signal from a second phase locked loop is out of phase with the second phase locked loop's VCO clock signal second by a predetermined number of the second phase locked loop's VCO clock cycles. Based upon the first and second signals, the lock detector determines whether the first and second phase locked loops are each locked.

In accordance with another aspect of the invention, a method of detecting lock in a system having a first and a second phase locked loop is provided. The method includes a first act of determining whether the first phase locked loop is in lock using a lock detector. A second act determines whether the second phase locked loop is locked using the lock detector. Should the first and second phase locked loops each be locked, the system is declared locked.

A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

DETAILED DESCRIPTION

Figure 1B:
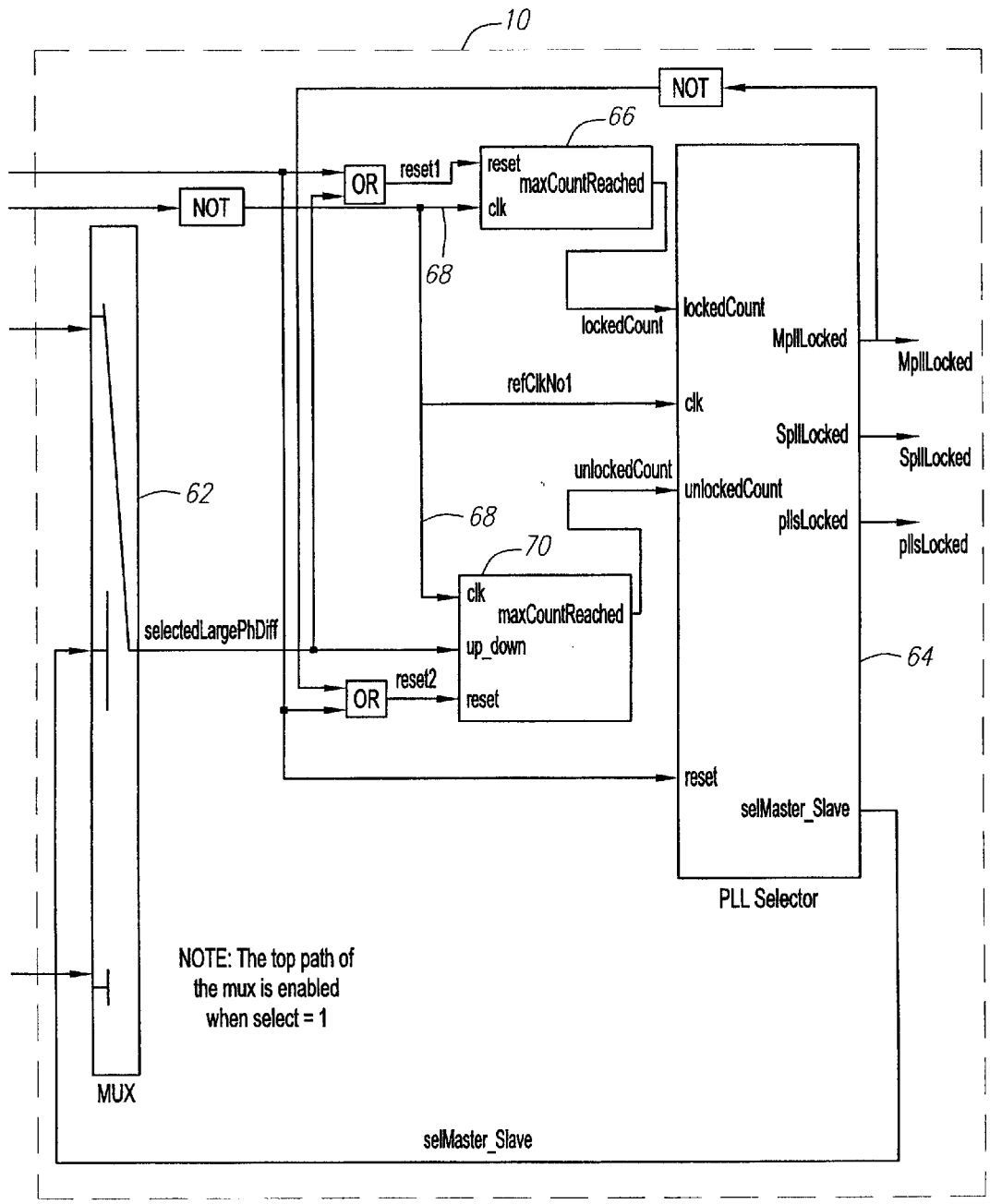
FIG. 1 is a block diagram of the dual-PLL lock detector monitoring a master and slave PLL according to one embodiment of the invention.

FIG. 1 shows a block diagram illustrating a dual phase locked loop lock detector 10 for detecting whether a master phase locked loop (PLL) 12 and a slave PLL 14 are each in a locked condition. Master PLL 12 produces a VCO clock signal 24 which, when frequency divided to form signal vcoDiv 21, is maintained within a phase tolerance with respect to the phase of a reference clock signal (refClk) 22. Similarly, slave PLL 14 produces a VCO clock signal 36 which, when frequency divided to form signal vcoDiv 25, is maintained within a phase tolerance with respect to the phase of a reference clock signal (refClk) 32. Each vcoDiv signal 21 and 25 is declared "in phase" with its reference signal if it does not lead or lag a predetermined number of its VCO clock cycles within a predetermined number of its reference clock cycles. To maintain this in-phase condition, each PLL 12 and 14 includes a voltage controlled oscillator (VCO) 16, charge pump and loop filter 18, and phase detector 20.

The operation of such PLL components is well known. For example, master PLL 12 receives the reference clock signal refCLk 22 at its phase detector 20. A loop divider 26 produces vcoDiv 21 whose frequency is an integer divisor or fractional divisor of the VCO clock signal's 24 frequency. Phase detector 20 then compare the phases of refClk 22 and vcoDiv 21. Depending upon the phase relationship between refClk 22 and vcoDiv 21, phase detector 20 adjusts the pulse widths of its output signals pumpup and pumpDown. In response to differences in these pulse widths, charge pump and loop filter 18 adjusts the voltage of a control signal 30. Master PLL VCO 16 changes the frequency of its VCO clock signal 24 in response to control signal 30. In this fashion, master PLL 12 maintains the phase of vcoDiv 21 locked to the phase of reference clock signal 22.

Slave PLL 14 operates in similar fashion. However, to establish a master-slave relationship, a reference clock signal 32 for slave PLL 14 is derived from master PLL's VCO clock signal 24 through an input divider 34 operating analogously to loop divider 26. Within slave PLL 14, the phase detector 20, loop divider 26, charge pump and loop filter 18, and VCO 18 operate as described with respect to master PLL 12 to produce a slave PLL vcoDIV signal 25 whose phase is locked to the phase of reference clock signal 32.

Lock detector 10 must sense whether either master PLL 12 or slave PLL 14 is out of lock. When out of lock, a PLL's frequency-divided clock signal's phase, will either lead or lag the phase of its reference signal by an arbitrary phase threshold during a certain time period. In one embodiment of the invention, this phase threshold or tolerance is set at 2 periods of the corresponding VCO's output signal while the period of time is set at 256 periods of the PLL's reference clock signal. It will be appreciated that such values may be varied depending upon the precision by which a user wishes to determine whether a "lock" condition has been achieved.

Figure 2:
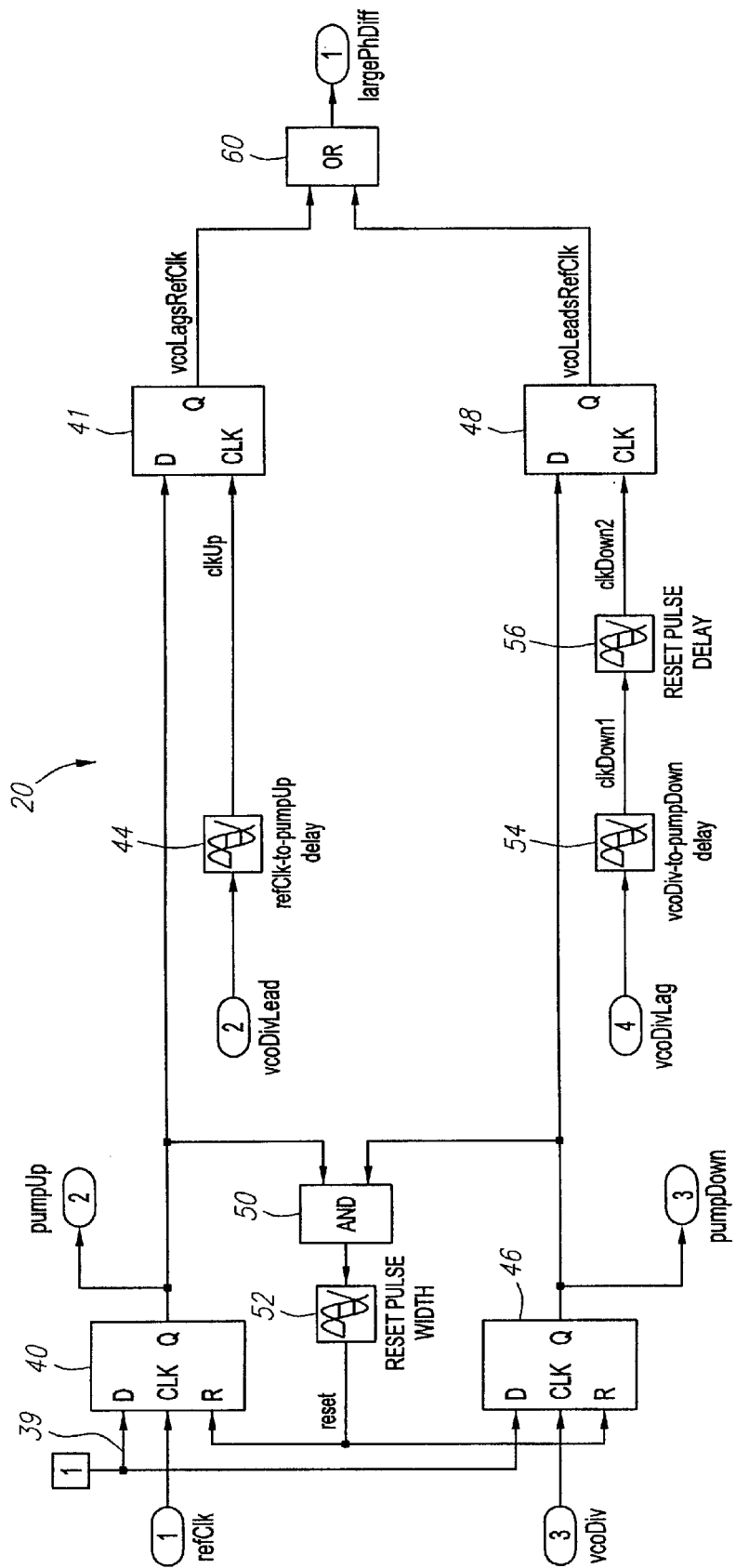
FIG. 2 is a block diagram of a phase detector for the PLLs of FIG. 1.

Referring now to FIG. 2, each phase detector 20 may signal that its phase threshold has been exceeded by setting an output signal (largePhdiff) signifying a large phase difference between the VCO's frequency-divided signal and its reference clock to a logical "1" value. The phase threshold may be established by three signals: vcoDiv, vcoDivLag, and vcoDivLead produced by the phase detector's loop divider 26. To do so, each loop divider has a serial chain of four flip-flops (not illustrated) clocked by its PLL's VCO clock signal. The VCO clock signal, after being frequency divided, becomes signal vcoDivLead. The first flip-flop in the chain receives vcoDivLead. The second flip-flop in the chain produces vcoDiv, and the fourth flip-flop in the chain produces vcoDivLag. Thus, the rising pulse edge in vcoDivLead occurs two periods of the VCO clock signal before that of vcoDiv, which in turn has a rising pulse edge occurring two period of the VCO clock signal before that of vcoDivLag. Phase detector 20 uses these signals as follows.

Phase detector 20 receives a reference clock (refClk, which can be either reference clock signal 22 or 32 depending upon whether phase detector 20 is within a master or slave PLL) at a clock input of a D-type flip-flop 40. This clock input latches a binary input signal 39 having a high value to produce the pumpup signal. As used herein, binary signals having a "high" value are considered a "1" and binary signals having a "low" value are considered a "0." Pumpup signal is received at the D input of a D-type flip-flop 41 clocked by a delayed version of vcoDivLead denoted as clkUp. To produce this delay, vcoDivLead is received by a delay buffer 44 that matches the delay through flip-flop 40 between the rising edge of the refClk and pumpup signals. Binary input signal 39 is also received at a D input of a D-type flip-flop 46. This voltage signal is latched at the rising edge of vcoDiv as received at the clock input of flip-flop 46 to produce pumpDown. A D-type flip-flop 48 receives PumpDown at its D input and is clocked by the rising edge of a signal denoted as clkDown2 to latch PumpDown to produce a signal (vcoLeadsRefclk) signifying that the frequency-divided VCO clock signal (vcoDiv) leads its VCO's reference clock. Both pumpup and pumpDown are received at an AND gate 50 whose output is delayed by a reset pulse width delay buffer 52 to produce a reset signal received by flip-flops 40 and 46. To produce signal clkDown2, vcoDivLag is delayed at delay buffers 54 and 56. Delay buffer 54 delays vcoDivLag by the vcoDiv-to-pumpDown rising edge delay experienced through flip-flip 46 to produce signal clkDown1. Delay buffer 56 delays clkDown1 by the reset pulse width delay period to produce clkDown2.

Figure 3:
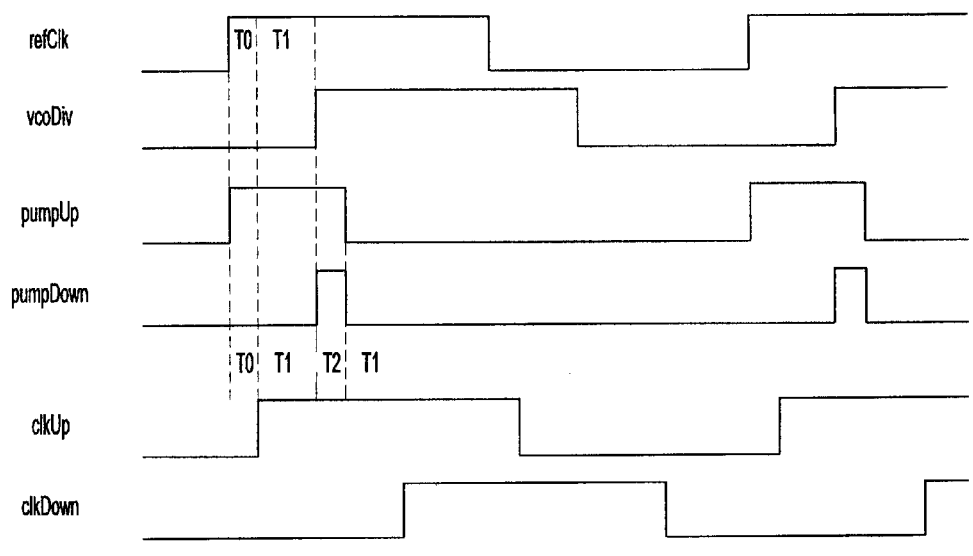
FIG. 3 is a timing diagram for several signals within the phase detector of FIG. 2 for the case of a VCO frequency divided signal lagging a reference clock.

FIG. 3 is a timing diagram illustrating the resulting signals should vcoDiv be lagging refClk by an amount T0 more than two VCO output signal clock periods (T1). In this example, the delay through flip-flops 40, 41, 46, and 48 is assumed to be zero. For example, under such an assumption, pumpUp will have a rising edge at the same time refClk does. Because of the timing relationship between signals vcoDivLead and vcoDiv, signal vcoDivLead (not illustrated) has a positive rising edge T1 seconds before the rising edge of vcoDiv. Given such signal timing, signal clkUp has a rising edge T1 seconds before the rising edge of vcoDiv as well. Accordingly, a signal (vcoLagsRefClk) signifying that vcodiv lags its VCO's reference clock will also have a rising edge T1 seconds before the rising edge of vcoDiv. Because signal vcoLagsRefClk is ORed at OR gate 60, signal largePhDiff will be high at this time to indicate that the phase threshold has been crossed. Assuming a zero vcoDiv-to-pumpDown delay through flip-flop 46, pumpDown has a rising edge occurring at the rising edge of vcoDiv. Given that pumpup is already high at this time, both pumpup and pumpDown will be reset low T2 seconds (reset pulse width delay) after the rising edge of vcoDiv. Because pumpDown will then be low, signal clkDown2, which has a rising edge T2 plus T1 seconds past the rising edge of pumpDown, will latch a signal vcoLeadsRefClk low at flip-flop 48. Signal vcoLeadsRefClk is only high when vcoDiv leads refCLk by more than two VCO clock cycles. Thus, when vcoDiv lags refClk by more than two VCO clock signal periods, only vcoLagsRefClk will be high whereas signal vcoLeadsRefClk will be low.

Figure 4:
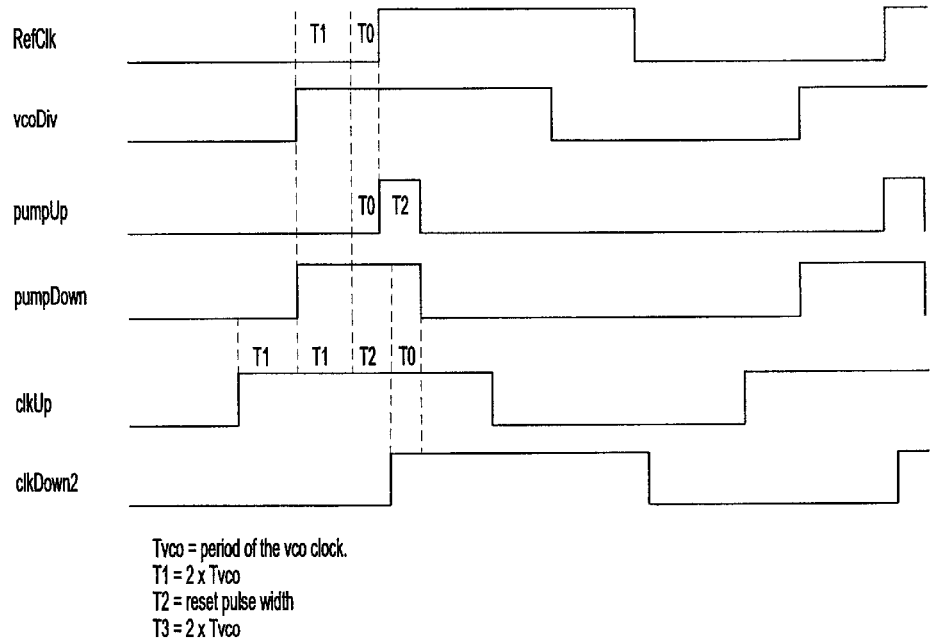
FIG. 4 is a timing diagram for several signals within the phase detector of FIG. 2 for the case of a VCO frequency divided signal leading a reference clock.

Turning now to FIG. 4, a timing diagram for the resulting signals should vcoDiv be leading refClk by an amount T0 more than two VCO output signal clock periods (T1) is illustrated. As discussed with respect to FIG. 3, the delays though flip-flops 40, 41, 46, and 48 are assumed to be zero. As discussed previously, signal clkup will have a rising edge Ti seconds before the rising edge of vcoDiv. Because vcoDiv leads refclk by T1 plus T0 seconds, pumpUp's rising edge won't occur until T1 plus T0 seconds after the rising edge of vcoDiv so that vcoLagsRefClk is latched in a low state. Signal clkDown2 has a rising edge T1 plus T2 seconds after the rising edge of vcoDiv. Because pumpDown is still high at this point, vcoLeadsRefClk is latched high, resulting in signal largePhDiff going high. Therefore, only vcoLeadsRefClk plays a role in forming signal largePhDiff when vcoDiv leads refclk by more than two VCO clock cycles. Reset for both pumpup and pumpDown occurs at time T2 seconds past the rising edge of pumpup. It will be appreciated that other forms of phase detectors are known in the art and may be implemented with the present invention.

Referring back to FIG. 1, signal largePhDiff for master PLL 12 is denoted as MasterLargePhDiff and for slave PLL 14 it is denoted as SlaveLargePhDiff. Lock detector 10 selects one of these two signals at a multiplexer 62 controlled by a signal (selMaster_Slave). A PLL selector 64 controls the state of selMaster_Slave to determine which PLL is being monitored. The default value of selMaster_Slave is set to monitor signal MasterLargePhDiff, thereby monitoring master PLL 12. The output signal of multiplexer 62 is denoted as selectedLargePhDiff. A counter 66 receives selectedLargePhDiff at its reset input. Counter 66 is clocked by a clock signal 68 that is an inverted version of refClk. The bit size of counter 66 determines the period of time during which a decision is made that the selected PLL is in lock. For example, if counter 66 is an 8-bit counter, it will monitor the selected PLL over 256 refClk cycles. For an 8-bit counter 66 embodiment, so long as selectedLargePhDiff stays low (indicating that the selected frequency-divided VCO clock signal (vcoDiv) is not leading or lagging its reference clock signal by more than 2 VCO clock cycles), counter 66 will count to 255 cycles of clock signal 68. If it goes high, counter 66 resets. Once counter 66 counts to 255, it pulses high an output signal (lockCount) signifying that lock is achieved, which is received by PLL selector 64.

An up/down counter 70 also receives clock signal 68. If selectedLargephDiff is high (indicating that the selected frequency-divided VCO clock signal (vcoDiv) is leading or lagging the reference clock by more than 2 VCO clock cycles), up/down counter 70 counts up at every cycle of clock signal 68. Alternatively, if selectedLargePhDiff is low, up/down counter 70 counts down at every cycle of clock signal 68. In an 8-bit up/down counter 70 embodiment, should the up/down counter 70 count to 255 cycles of clock signal 68, it pulses an output signal (unlockedCount) to signify that the selected PLL is out of lock. If up/down counter is at zero and is asked to count down (selectedLargePhDiff being low), it will remain at zero rather than cycle back to 255. For example, if up/down counter has counted to three and over the next four cycles of clock signal 68 selectedLargePhDiff is low, up/down counter will count to two, one, zero, and then zero again. In this fashion, a false indication that a selected PLL is out of lock is avoided. Otherwise, should up/down counter "wrap around" from zero to 255, unlockedCount would pulse high even though the selected PLL being monitored was locked. Unlike counter 66, up/down counter 70 does not require 255 consecutive events for its output unlockedCount to pulse high. Rather than responding to consecutive events, unlockedCount will pulse high when there are more refClk periods where selectedLargePhDiff is low than refClk periods where it is high. Both counter 66 and up/down counter 70 may be reset by a power on reset signal 72. It will be appreciated that adjusting the bit size of counter 66 and up/down counter 70 adjusts the corresponding period over which a lockedCount or unlockedCount decision is made.

PLL selector 64 uses unlockedcount and lockedcount to determine whether the master PLL 12 and slave PLL 14 are each locked. PLL selector 64 signifies that master PLL 12 is in lock by bringing an output signal, MpllLocked, high. Similarly, PLL selector 64 signifies that slave PLL 14 is in lock by bringing an output signal, SpllLocked, high. If both master PLL 12 and slave PLL 14 are locked (signals MpllLocked and SpllLocked being high), PLL selector 64 brings high an output signal (pllsLocked).

Figure 5:
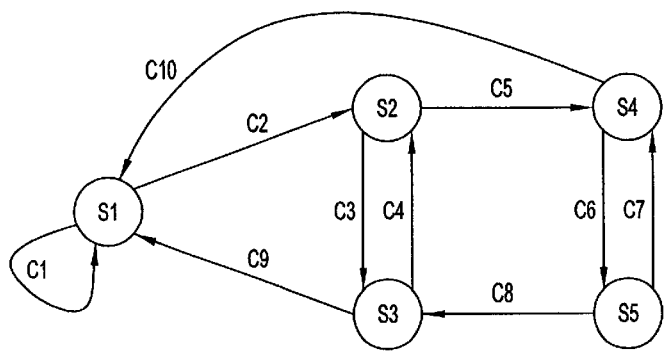
FIG. 5 is a state diagram for the dual-PLL lock detector of FIG. 1.

A state diagram illustrated in FIG. 5 summarizes the operation of lock detector 10 regarding which PLL is being monitored (through signal selectedLargePhDiff). State Si indicates that both master PLL 12 and slave PLL 14 are unlocked (MpllLocked and SpllLocked being zero). As used herein, a PLL is said to be "unlocked" if it is out of lock. Lock detector 10 starts in state S1. Because slave PLL 14 uses a frequency-divided version of VCO clock signal 24 from master PLL 12 as it reference clock 32, slave PLL 14 cannot be in lock if master PLL 12 is not in lock. Thus, preference is given to monitor master PLL 12 over monitoring slave PLL 14, which is reflected in multiplexer 62 defaulting to select MasterLargePhDiff at startup. Condition C1 indicates that lock detector 10 remains in state C1 if master PLL 12 remains unlocked.

Should master PLL 12 become locked at state S1 (condition C2), lock detector 10 transitions to state S2. In state S2, the master PLL 12 is locked and slave PLL 14 is unlocked. Thus, multiplexer 62 (FIG. 1) will transition to selecting signal SlaveLargePhDiff so that the slave PLL 14 is monitored. Should slave PLL 14 become locked at state S2 (condition C5), lock detector 10 transitions to state S4 to begin monitoring the master PLL 12.

In state S4, PLL selector 64 (FIG. 1) brings a signal (pllsLocked) high to signify that both the master PLL 12 and slave PLL 14 are locked. After verifying that the master PLL 12 remains locked (condition C6), lock detector 10 transitions to monitoring slave PLL 14 at state S5. If slave PLL 14 remains locked (condition C7), lock detector 10 transitions back to monitoring master PLL 12 at state S4. Thus, assuming that both PLLs remain locked, lock detector 10 will continually transition between states S4 and S5, maintaining signal pllsLocked high.

Lock detector 10 can transition from states S4 and S5 into other states in only two ways. In a first way at state S4, lock detector 10 could observe that master PLL 12 is unlocked (condition C10). Lock detector 10 would then transition back to initial state S1 because of the master/slave PLL arrangement. In a second way at state S5, lock detector 10 could detect that slave PLL 14 is unlocked (condition C8) and transition to state S3. In state S3, lock detector 10 monitors whether master PLL 12 is locked.

From state S3, two conditions may occur. In a first condition (condition C4), lock detector 10 determines that master PLL 12 is locked and transitions to state S2 to begin monitoring slave PLL 14. In a second condition (condition C9), lock detector 10 determines that master PLL 12 is unlocked and transitions to initial state S1. Finally, at state S2, should lock detector 10 determine that slave PLL 14 is unlocked (condition C3), lock detector 10 transitions to state S3 to monitor whether master PLL 12 is locked.

The states and conditions may be summarized in the following two tables. Table 1 summarizes the states and table 2 summarizes the conditions.

TABLE 1

| State | Master PLL locked? | Slave PLL locked? | Which PLL is being monitored? |
|---|---|---|---|
| S1 | No | No | Master |
| S2 | Yes | No | Slave |
| S3 | Yes | No | Master |
| S4 | Yes | Yes | Master |
| S5 | Yes | Yes | Slave |

TABLE 2

| Condition | Master PLL locked? | Slave PLL locked? |
|---|---|---|
| C1 | No | Not being monitored |
| C2 | Yes | Not being monitored |
| C3 | Not being monitored | No |
| C4 | Yes | Not being monitored |
| C5 | Not being monitored | Yes |
| C6 | Yes | Not being monitored |
| C7 | Not being monitored | Yes |
| C8 | Not being monitored | No |
| C9 | No | Not being monitored |
| C10 | No | Not being monitored |

Figure 6:
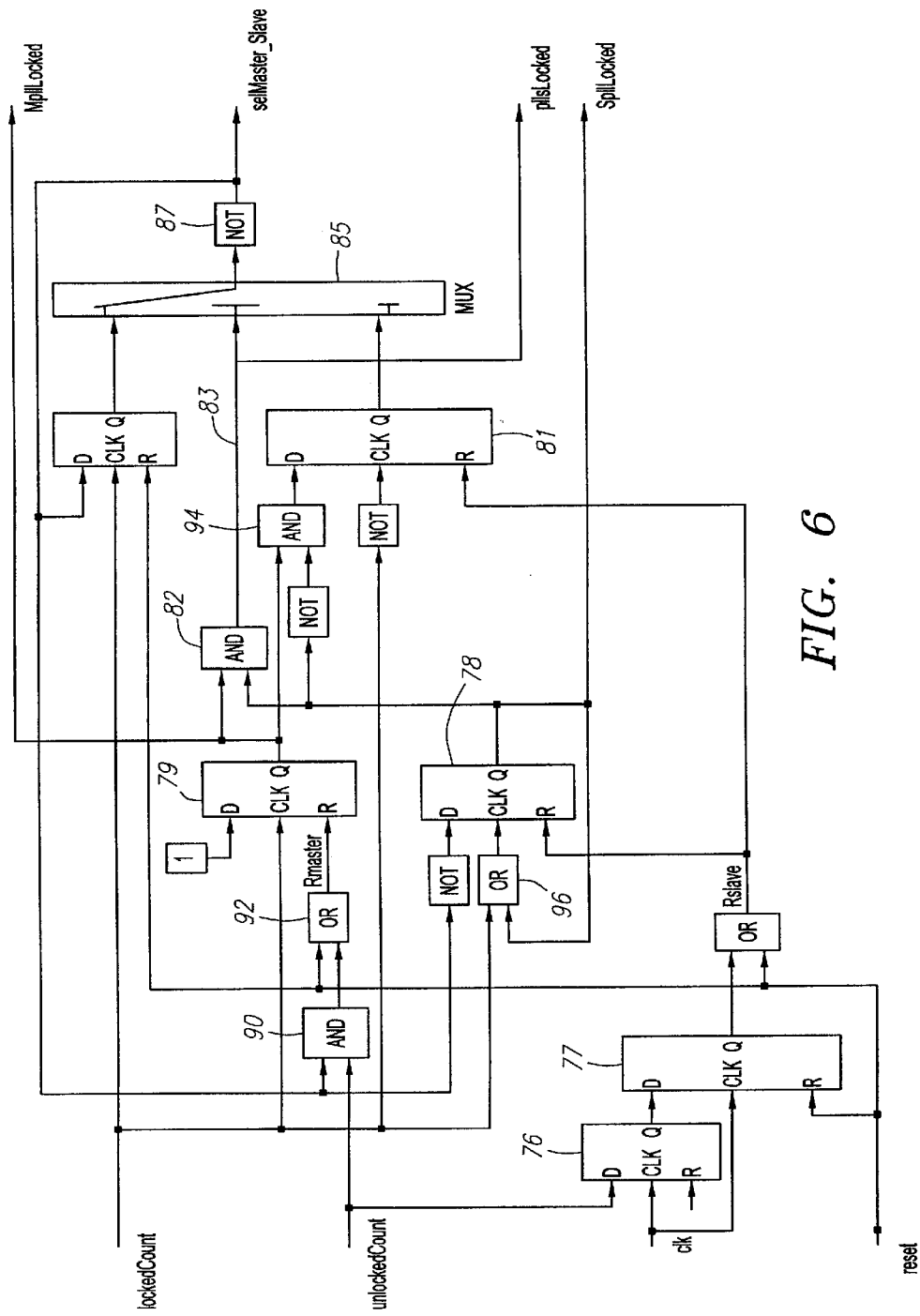
FIG. 6 is a block diagram for the PLL selector in FIG. 1.

An embodiment of PLL selector 64 is illustrated in FIG. 6. PLL selector 64 has 6 D-type flip-flops 76 through 81. Each flip-flop 76 through 81 resets in response to power-on reset signal 72. Thus, at power-on, the Q outputs of flip-flops 76 through 81 reset to zero. In particular, both Q outputs of flip-flops 78 and 79 reset to zero. These outputs are received at AND gate 82 to produce control signal 83 controlling multiplexer 85. Multiplexer 85 selects the Q output of flip-flop 81 when control signal 83 is low. Thus, multiplexer 85 selects the Q output of flip-flop 81 at power-on. Because of the inversion at inverter 87, selMaster_Slave is high, such that multiplexer 62 (FIG. 1) selects MasterLargePhDiff to become selectedLargePhDiff. Lock detector 10 is then at state S1 of FIG. 5. During this state, if unlockedCount goes high (condition C1) should master PLL 12 become unlocked, the output of AND gate 90 will be high because it ANDS signals unlockedCount and selMaster_Slave. In turn, because the power-on reset signal 72 is ORed with the output of AND gate 90 at OR gate 92, the reset signal (Rmaster) for flip-flop 79 is high. This brings MpllLocked low, indicating the unlocked condition of master PLL 12.

Alternatively, if lockedCount pulses high during state S1, the Q output of flip-flop 79 will go high, bringing MpllLocked high to signify that the master PLL 12 is locked (condition C2). Lock detector 10 then transitions to state S2. Note that a high value for lockedCount will not change the value (zero) of the Q output for flip-flop 78 during state S1 because selMaster_Slave is inverted and coupled to the D input of flip-flop 78. Because the Q output of flip-flop 78 will be low, the value of SpllLocked will be zero to signify that the slave PLL 14 is not locked.

When lock detector 10 transitions to state S2, it will begin monitoring slave PLL 14. This requires the value of selMaster_Slave to go from one to zero in the following manner. As lock detector 10 just transitions to state S2, the inputs to AND gate 82 will be one and zero because the Q output of flip-flop 79 is high and the Q output of flip-flop 78 is low. Thus the control signal 83 to multiplexer 85 will be low, selecting the Q output of flip-flop 81. Because the output of AND gate 94 forms the D input for flip-flop 81, this output controls the state of the flip-flop's Q output. Since AND gate 94 receives the Q output of flip-flop 79 (which will be high at this point) and an inverted version (which will also be high at this point) of the Q output of flip-flop 78, the Q output of flip-flop 81 will be high at the falling edge of lockedCount, making selMaster_Slave go to zero. This allows the monitoring of slave PLL 14 during state S2.

Lock detector 10 transitions from state S2 to state S3 in the following manner. In state S2, if unlockedCount pulses high (condition C3) should slave PLL 14 be unlocked, selMaster_Slave being zero prevents the output of AND gate 90 from going high. In turn, this brings signal Rmaster low, preventing the Q output of flip-flop 79 from resetting in response to unlockedCount pulsing high. When unlockedcount pulses high, the Q outputs of serially-coupled flip-flops 76 and 77 will go high. Because the Q output of flip-flop 77 is high, signal Rslave will reset flip-flop 78, bringing SpllLocked low to signify that slave PLL 14 is unlocked. In addition, Rslave resets flip-flop 81 so that its Q output signal goes to zero. Because SpllLocked is zero, the control signal 83 for multiplexer 85 will also be zero, making the multiplexer choose the Q output of flip-flop 81. Thus, as lock detector 10 transitions to state S3, it will monitor master PLL 12 (selMaster_Slave going high). Note that if flip-flops 76 and 77 were not included in this embodiment of PLL selector 64, unlockedCount would still be high when lock detector 10 transitions to state S3. This would give a false indication that master PLL 12 is out of lock.

If lockedCount pulses high during state S3 (condition C4) should master PLL 12 remain locked, flip-flop 79 sets its Q output to high (leaving this signal unchanged since it was already set to a value of one). Flip-flop 81 will then latch its Q output high. With MpllLocked equaling one and SpllLocked equaling zero, AND gate 82 will set control signal low, making multiplexer 85 select the Q output of flip-flop 81. Thus, lock detector 10 will transition back to state S2.

If unlockedCount pulses high during state S3 (condition C9) should master PLL 12 become unlocked, flip-flop 79 resets, bringing MpllLocked low to signify that master PLL 12 is unlocked. Control signal 83 remains low so that multiplexer 85 continues to select the Q output of flip-flop 81. This flip-flop will be reset after the high value of unlockedCount ripples through flip-flops 76 and 77 to bring Rslave high. Thus, SelMaster_Slave remains high and lock detector 10 transitions to state S1.

For lock detector 10 to transition from state S2 to S4, lockedCount will pulse high (condition C5) should slave PLL 14 be locked. The Q output of flip-flop 78 will then go high, bringing SpllLocked high to signify that slave PLL 14 is locked. Because both SpllLocked and MpllLocked are high, control signal 83 goes high, forcing multiplexer 85 to select the Q output of flip-flop 80. The same rising edge of lockedCount that brought SpllLocked high clocks flip-flop 80 to latch signal selMaster_Slave, which is zero at this point. Thus, the output of inverter 87 will be high, bringing selMaster_Slave high so that lock detector 10 transitions to state S4 and begins monitoring master PLL 12. At the same time, because control signal 83 is high, signal pllsLocked is high to signify that both master PLL 12 and slave PLL 14 are locked. At the falling edge of lockedCount flip-flop 81 is clocked, latching the zero outputted by AND gate 94. AND gate 94 outputs a zero because it multiplies MpllLocked (which is a one at this point) with the inverse of SpllLocked (the inverse being a zero at this point).

From state S4, lock detector will transition to state S5 if lockedcount pulses high (condition C6) should master PLL 12 be locked. When lockedcount pulses high in state S4, flip-flop 80 latches selMaster_Slave having a high value, which is selected by multiplexer 85 because both SpllLocked and MpllLocked signals are high. Thus, selMaster_Slave goes low because of the inversion at inverter 87. Flip-flop 78 will not respond to the rising edge of lockedCount because SpllLocked, being high, forces OR gate's 96 output to be high. Because OR gate's 96 output is high, the clock input of flip-flop 78 is held high so that it cannot respond to any rising edge being present in signal lockedcount. Thus, SpllLocked stays high while flip-flop 79 maintains MpllLocked high. Because selMaster_Slave is brought low, lock detector 10 transitions to monitoring slave PLL 14 in state S5. Note that when lock detector 10 is in state S4 or 5, control signal 83 remains high because both MpllLocked and SpllLocked are high. Thus multiplexer 85 will always select the Q output of flip-flop 80. In turn, this selected Q output inverts at inverter 87 and forms selMaster_Slave which feeds back as the D input for flip-flop 80. Thus, the value of selMaster_Slave will alternate at every rising edge of lockedCount causing lock detector 10 to transition between states S4 and S5 (assuming unlockedcount does not pulse high).

If lockedCount pulses high in state S5 (condition C7) should slave PLL 14 be locked, flip-flop 78 will not respond as discussed for state S4, maintaining SpllLocked high. Thus, pllsLocked remains high to signify that both master PLL 12 and slave PLL 14 remain locked. Signal pllsLocked has a high value only during states S4 and S5. Flip-flop 80 will latch selMaster_Slave so that inverter 87 receives a low value signal, thereby bringing selMaster_Slave high. Thus, lock detector 10 will transition to monitor master PLL 12 (state S4) if lockedCount pulses high in state S5.

Should slave PLL 14 become unlocked when lock detector 10 is in state S5, unlockedcount will pulse high (condition C8). Signal unlockedcount cannot bring signal Rmaster high because the zero from selMaster_Slave blocks unlockedcount at AND gate 90. Thus, MpllLocked doesn't respond to this indication that slave PLL 14 is unlocked. However, SpllLocked is brought low after the high value of unlockedCount ripples through flip-flops 76 and 77 to bring Rslave high, resetting flip-flop 78. Because SpllLocked is low, control signal 83 is brought low, requiring multiplexer 85 to select the Q output of flip-flop 81, which was reset by the high value of Rslave. Accordingly, inverter 87 brings selMaster_Slave high so that lock detector 10 transitions to state S3 and begins monitoring master PLL 12.

If master PLL 12 goes unlocked while lock detector 10 is in state S3, unlockedCount will pulse high (condition C9). Flip-flop 78 then latches an inverted value of selMaster_Slave, bringing its Q output low so that SpllLocked stays at zero. In addition, the high value for unlockedCount can pass through AND gate 90 because selMaster_Slave is high, bringing Rmaster high to reset flip-flop 79. Thus, MpllLocked will go low to signify that master PLL 12 is out of lock. Signal selMaster_Slave stays high so that lock detector 10 continues to monitor master PLL 12 as lock detector 10 transitions to state S1.

Finally, if master PLL 12 goes unlocked while lock detector 10 is in state S4, unlockedCount will pulse high (condition C10). The high value for unlockedcount will ripple through flip-flops 76 and 77 to bring Rslave high, resetting flip-flop 78 and bringing SpllLocked low. In addition, the high value for unlockedCount will not be blocked at AND gate 90 (selMaster_Slave being high) so that Rmaster goes high to reset flip-flop 79, bringing MpllLocked low to signify that the master PLL 12 is unlocked. The resetting of either flip-flop 78 or 79 will bring control signal 83 low, requiring multiplexer 85 to select the Q output from flip-flop 81. This output will be zero because flip-flop 81 resets in response to the high value of Rslave. Thus, selMaster_Slave remains high, so that lock detector 10 continues to monitor master PLL 12 as it transitions to state S1.

Although the invention has been described with respect to a master/slave dual PLL arrangement, it will be appreciated that the invention is easily adapted to monitor dual phase locked loops that are not in a master slave arrangement. Thus, while this invention has been described with respect to illustrative embodiments, other embodiments of the invention will be apparent to persons skilled in the art. Accordingly, the scope of the invention is defined only by the following claims.

I claim:

1. A method of detecting lock in a system having a first phase locked loop and a second phase locked loop, comprising:
   (a) determining whether the first phase locked loop is in lock using a lock detector;
   (b) determining whether the second phase locked loop is in lock using the lock detector; and
   (c) if acts (a) and (b) determine that the first phase locked loop and the second phase locked loop are each in lock, declaring the system locked.

2. The method of claim 1, wherein an output of the first phase locked loop is used to form an input to the second phase locked loop, and wherein act (b) is performed only if act (a) determines that the first phase locked loop is in lock.

3. The method of claim 2, wherein act (a) comprises determining whether a rising edge of a frequency-divided version of a VCO clock output from the first phase locked loop is neither leading or lagging a rising edge of its reference clock input by a first predetermined number of VCO clock cycles within a period of a second predetermined number of cycles of its reference clock.

4. The method of claim 3, wherein act (b) comprises determining whether a rising edge of a frequency divided version of the VCO clock output of the second phase locked loop is neither leading or lagging a rising edge of its reference clock input by the first predetermined number of VCO clock cycles within the period of the second predetermined number of cycles of the reference clock of the first phase locked loop.

5. The method of claim 4, wherein the first predetermined number is two and the second predetermined number is 256.

6. A circuit, comprising:
   a first phase detector for producing a first signal indicating whether a phase difference between a frequency divided version of a VCO clock output from a first phase locked loop and its reference clock has exceeded a first threshold;
   a second phase detector for producing a second signal indicating whether a phase difference between a frequency divided version of a VCO clock output from a second phase locked loop and its reference clock has exceeded a second threshold; and
   a lock detector configured to determine whether the first phase locked loop and the second phase locked loop are each in lock based on observing the first signal and the second signal.

7. The circuit of claim 6, wherein a frequency divided version of the VCO clock output from the first phase locked loop forms the reference clock signal for the second phase locked loop, the lock detector being configured to determine if the second phase locked loop is in lock only if the lock detector has determined that the first phase locked loop is in lock.

8. The circuit of claim 7, wherein the first threshold is two periods of the first phase locked loop's VCO clock output and the second threshold is two periods of the second phase locked loop's VCO clock output.

9. The circuit of claim 8, wherein the lock detector comprises a counter, the counter being configured to determine if the first phase locked loop is locked by counting consecutive cycles of the first phase locked loop's reference clock over which the first signal indicates that the threshold has not been exceeded.

10. The circuit of claim 9, wherein the counter is configured to determine that the second phase locked loop is in lock by counting consecutive cycles of the reference clock of the first phase locked loop over which the second signal indicates that the threshold has not been exceeded.

11. A circuit, comprising:
    a first phase detector for producing a first signal indicating whether a phase difference between a frequency divided version of a VCO clock output from a first phase locked loop and its reference clock has exceeded a threshold;
    means for determining whether the first phase locked loop is in lock by using the first signal; and
    a second phase detector for producing a second signal indicating whether a phase difference between a frequency divided version of a VCO clock output from a second phase locked loop and its reference clock has exceeded the threshold, wherein the means also determines whether the second phase locked loop is in lock by using the second signal.

* * * * *